(12) United States Patent
Michallick et al.

(10) Patent No.: US 8,947,118 B2
(45) Date of Patent: Feb. 3, 2015

(54) DEFECT DETECTION IN INTEGRATED CIRCUIT DEVICES

(75) Inventors: Ronald Andrew Michallick, McKinney, TX (US); Michael Nolan Jervis, McKinney, TX (US); Rex Warren Pirkle, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 250 days.

(21) Appl. No.: 13/372,328

(22) Filed: Feb. 13, 2012

(65) Prior Publication Data

US 2013/0207686 A1   Aug. 15, 2013

(51) Int. Cl.
*G01R 31/26* (2014.01)
*G01R 31/02* (2006.01)

(52) U.S. Cl.
USPC ............. 324/762.03; 324/762.01; 324/762.05

(58) Field of Classification Search
None
See application file for complete search history.

(56) References Cited

U.S. PATENT DOCUMENTS

| | | | |
|---|---|---|---|
| 6,440,757 B1* | 8/2002 | Yang | 438/4 |
| 2003/0069706 A1* | 4/2003 | Madge | 702/81 |
| 2005/0090027 A1* | 4/2005 | Aghababazadeh et al. | 438/17 |
| 2005/0090916 A1* | 4/2005 | Aghababazadeh et al. | 700/90 |
| 2005/0288899 A1* | 12/2005 | Winstead et al. | 702/183 |

* cited by examiner

*Primary Examiner* — Melissa Koval
*Assistant Examiner* — Courtney McDonnough
(74) *Attorney, Agent, or Firm* — Steven A. Shaw; Frederick J. Telecky, Jr.

(57) ABSTRACT

In a method of testing integrated circuit devices, a parameter, such as initial voltage may first be measured. A low pass filter operation may be applied to the measured data to generate peer data. A particular integrated circuit device may be identified as failed or rejected when its measured parameter varies sufficiently relative to the peer data.

18 Claims, 4 Drawing Sheets

DEFECT DETECTION IN INTEGRATED CIRCUIT DEVICES

BACKGROUND

Typical integrated circuit devices contain multiple printed circuit layers. Each layer is insulated from its adjacent layer except where interlayer connections are selectively created. The individual circuit layers of an integrated circuit device are typically created by a photolithographic process. Each layer is formed on an integrated circuit device during a separate trip through the photolithographic manufacturing area. After each trip, the integrated circuit device is transported to other manufacturing areas where additional processing steps, such as etching and deposition, are performed. Thereafter, the integrated circuit device is returned to the photolithographic process manufacturing area so that an additional circuit layer may be applied. The process is then repeated until the desired number of circuit layers has been created.

During the manufacture of integrated circuit devices, several devices are typically formed on a single silicon substrate which is commonly referred to in the industry as a "wafer". A single wafer may, for example, contain well over 100 integrated circuit devices. When the manufacture of the integrated circuit devices on a wafer is completed, the wafer is sawn apart such that the integrated circuit devices contained thereon are separated into individual units.

During the wafer manufacturing process, it is often desirable to tightly control various parameters of the integrated circuit devices, or portions thereof. For example, many integrated circuit devices are required to generate an accurate reference voltage. To be accurate requires precise control of two or more process values and precise matching in the critical components that generate the reference voltage. This level of control and matching is often not practical to achieve. Therefore, an alternative approach is needed.

The most popular alternative approach is a method known as "trim". Trim allows process values of the components to be changed after wafer manufacture. The values are changed to set the reference voltage very close to the ideal target. The agent of change may, for example, take the form of shorting diodes to lower resistance, opening fuse links to increase resistance, or laser cutting resistors to increase resistance.

DETAILED DESCRIPTION

Figure 1:
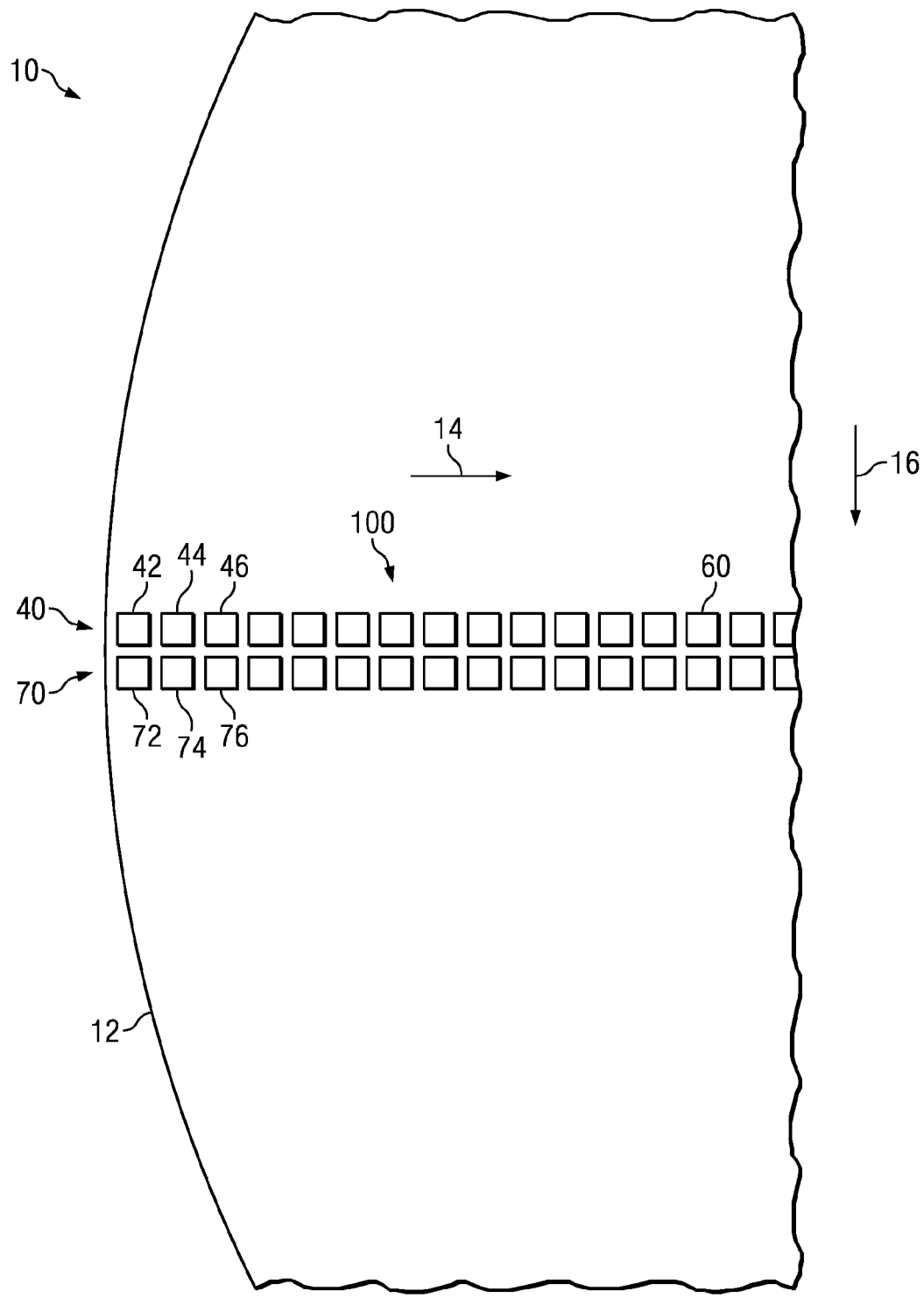
FIG. 1 is a schematic top plan view of a portion of a wafer containing a plurality of integrated circuit devices.

FIG. 1 schematically illustrates a portion of a wafer 10. The wafer 10 may, for example, be circular in cross-section, with a portion of the curved edge 12 of the wafer being illustrated in FIG. 1. A plurality of integrated circuit devices 100 may be formed on the wafer 10, as shown. Specifically, the integrated circuit devices 100 may generally be arranged in a plurality of horizontally-extending series (as viewed in FIG. 1). It is noted that, although these series of integrated circuit devices may extend over the entire surface of the wafer 10, for purposes of illustrative clarity, only two of the series 40 and 70 are shown in FIG. 1.

With continued reference to FIG. 1, it can be seen that each of the series 40, 70 may include a plurality of integrated circuit devices. The series 40 may, for example, include the individual integrated circuit devices 42, 44, 46 and 60 while the series 70 may, for example, include the individual integrated circuit devices 72, 74 and 76.

As mentioned previously, it is often desirable, during the wafer manufacturing process, to tightly control various parameters of the integrated circuit devices, or portions thereof. To achieve such control of reference voltage, for example, the initial reference voltage (sometimes referred to herein simply as the "initial voltage") of each integrated circuit device is typically first sampled or tested. Such testing is commonly achieved through the use of a conventional probing device. The probing device may, for example, test the initial voltage of each integrated circuit device on the wafer by proceeding in a series by series sampling pattern.

With reference again to FIG. 1, in order to sample the series 40, for example, the probing device may sequentially test the integrated circuit devices in the series from left to right (i.e., in the direction 14). Accordingly, the probing device may begin by testing integrated circuit device 42 and then the next integrated circuit device 44, and then the integrated circuit device 46 and so on. When the probing device has completed sampling the series 40, testing may then advance downwardly in the direction 16 in order to sample the next series 70. Sampling of the series 70 may then proceed in a similar manner, beginning with the integrated circuit device 72 and then proceeding in the direction 14 to sample the integrated circuit device 74, and then the integrated circuit device 76, and so on. Upon completion of the series 70, sampling may begin on the next series, and so on. In this manner, all of the integrated circuit devices 100 on the wafer may be tested. Alternatively, the probing device may follow a different pattern. For example, after sampling of the series 40 has been completed in the direction 14 (in a manner as described above), sampling of the series 70 may begin at the right edge of the wafer and proceed in a the direction opposite the direction 14. As a further alternative example, sampling may proceed in a diagonal pattern.

Figure 2:
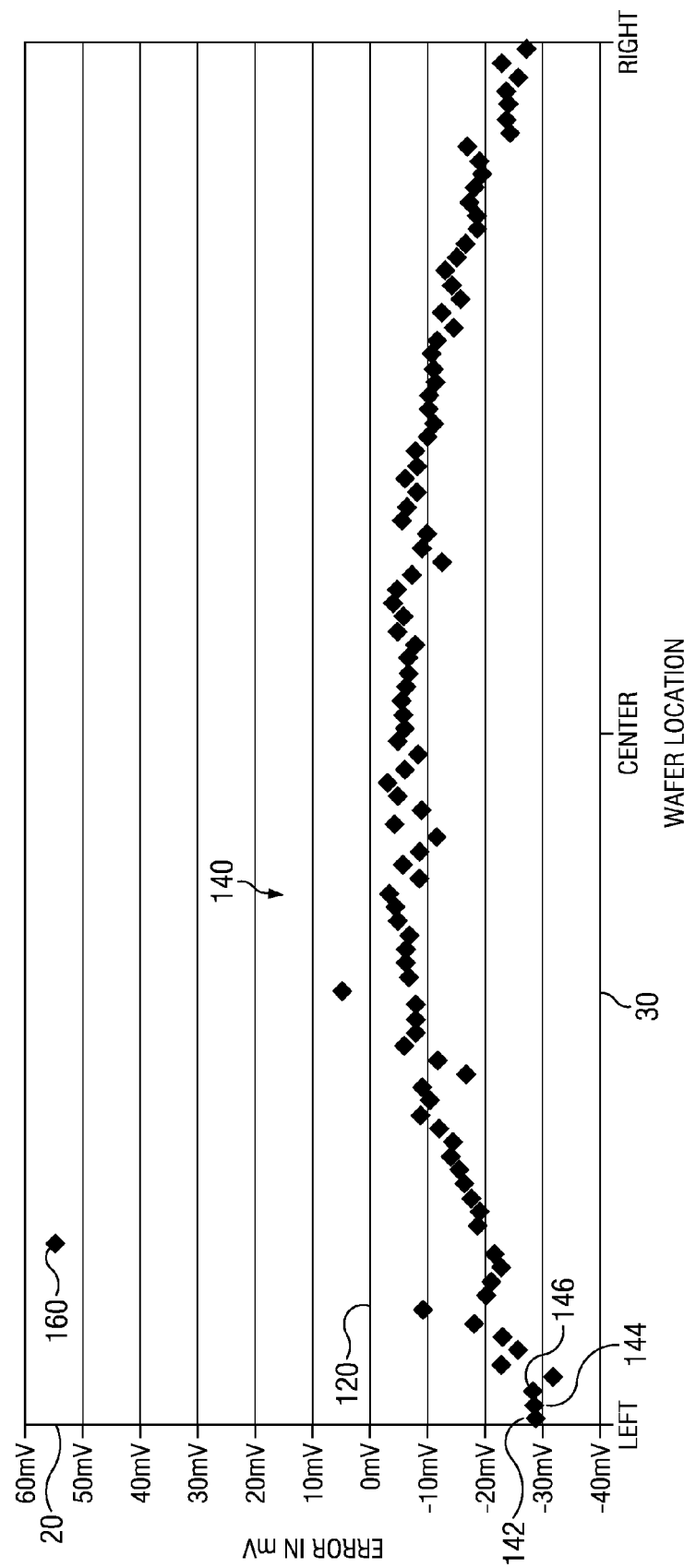
FIG. 2 is a graph illustrating exemplary output from testing a single series of integrated circuit devices on the wafer of FIG. 1.

FIG. 2 graphically illustrates exemplary output from testing a single series of integrated circuit devices on the wafer 10, e.g., the series 40, FIG. 1. Specifically, in the graph of FIG. 2, the x-axis 30 indicates the spatial position of the sampled integrated circuit device across the wafer (from left to right, as viewed in FIG. 1). The y-axis 20, on the other hand, indicates the tested initial voltage error, i.e., the amount by which the sampled initial voltage for each integrated circuit device deviates from a desired or "target" reference voltage. The plotted data points 140 correspond to the initial voltage errors for each integrated circuit device located within the series 40, FIG. 1. Specifically, for example, the plotted data points 142, 144, 146, and 160 correspond to the initial voltage errors for the integrated circuit devices 42, 44, 46, and 60, respectively. The zero line 120 in the graph of FIG. 2, indicates a position along the y-axis 20 denoting zero error, i.e., where the tested initial voltage is equal to the target reference voltage. Points lying above the zero line 120 indicate a positive tested initial voltage error (i.e., the tested initial voltage is higher than the target reference voltage). Conversely, points lying below the zero line 120 indicate a negative tested initial voltage error (i.e., the tested initial voltage is lower than the target reference voltage).

There are generally three types of reference voltage errors observable during the integrated circuit device manufacturing process: errors caused by random mismatch, errors caused by process shift, and errors caused by random defects. These error types are discussed below at more length.

Random Mismatch Errors

As discussed previously, generating an accurate reference voltage requires, for example, precise matching in the critical components on an integrated circuit device that generate the reference voltage. Random mismatch errors result from the failure to maintain this precise matching. FIG. 2 illustrates, in an exemplary manner, the effect of random mismatching on a set of tested initial voltages. With reference to FIG. 2, it can be seen that the majority of the tested initial voltage errors of the exemplary points 140 generally vary from about −30 mV at the outer edges of the wafer to about −5 mV near the center of the wafer. Although the generally parabolic shape of the curve in FIG. 2 is caused by process shift across the wafer, the "noise" in the waveform points are due to random mismatch error. This random mismatch error is primarily due to random mismatching, within the integrated circuit devices 100, of the critical components of the integrated circuit devices 100 that generate reference voltage. Variations caused by this type of random mismatching tend to exhibit a normal distribution and are easily compensated by using a conventional trim program.

As previously discussed, a trim program allows process values of the integrated circuit device components to be changed after wafer manufacture. Specifically, the values may be changed to set the reference voltage of each integrated circuit device to a point very close to the ideal target. As also previously discussed, the agent of change used by the trim program may, for example, include shorting diodes to lower resistance, opening fuse links to increase resistance, or laser cutting resistors to increase resistance. Accordingly, the trim program is able to adjust the reference voltages of the integrated circuit devices 100 to compensate for reference voltage deviations caused by random mismatching.

Process Shift Errors

In addition to random mismatch errors, as discussed above, reference voltage can also be impacted by process shift errors. Process shift errors may, for example, be the result of variations in the resistance of resistors residing on the integrated circuit devices. More specifically, higher resistance tends to decrease collector current which, in turn, decreases the transistor's base emitter voltage and, thus, the reference voltage of the integrated circuit device. Process shift errors may also, for example, be caused by transistor beta shifts; higher beta tends to decrease the transistor's base emitter voltage while lower beta tends to raise it.

Figure 3:
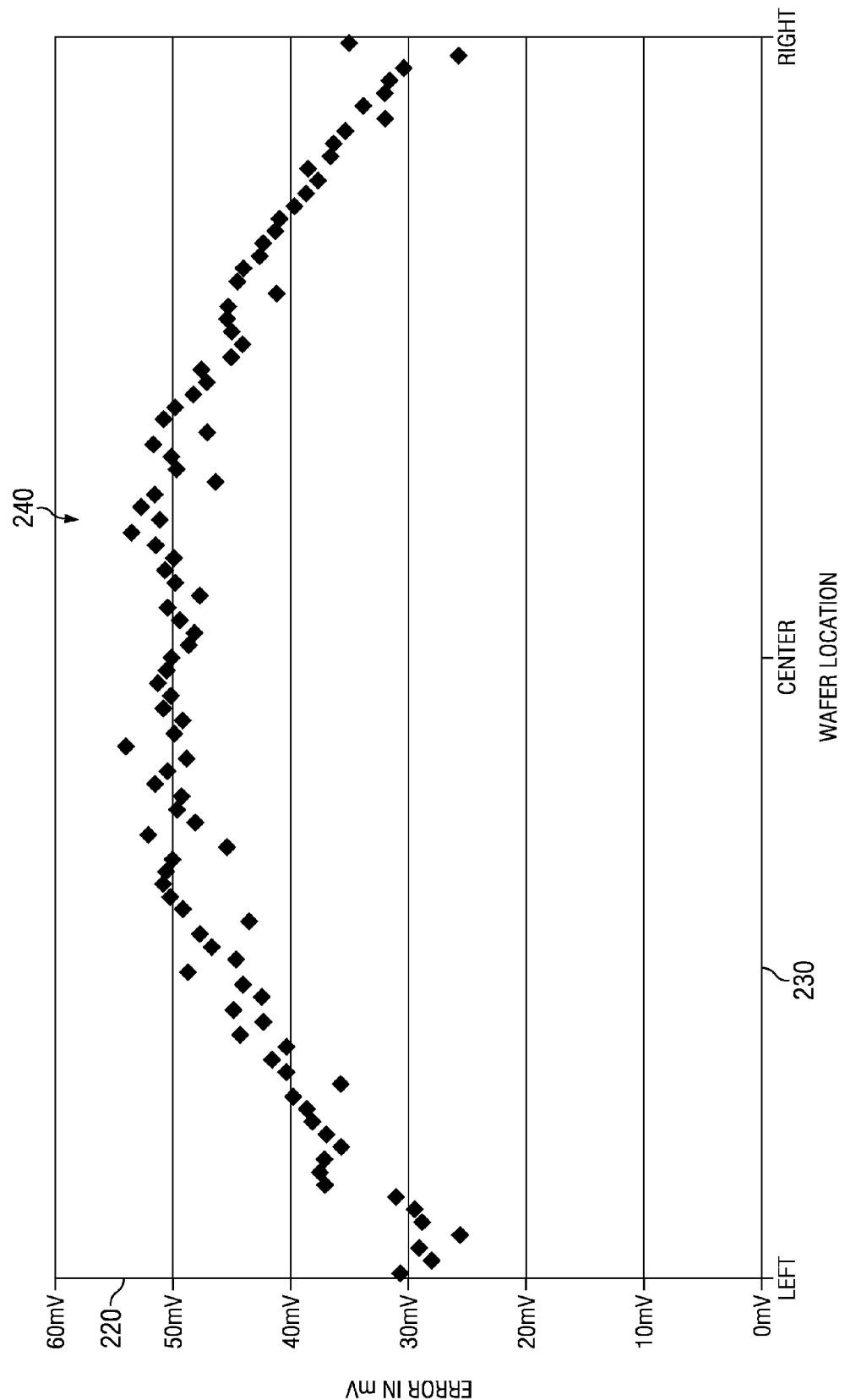
FIG. 3 is a graph illustrating exemplary output from testing a different series of integrated circuit devices on a wafer.

As discussed above, the generally parabolic shape of the curve in FIG. 2 is caused by process shift across the wafer. FIG. 3 schematically illustrates a more dramatic effect of process shift error that might be caused, for example, by wafer-to-wafer or lot-to-lot variations. More specifically, FIG. 3 graphically illustrates exemplary output from testing a single series of integrated circuit devices on a wafer (e.g., the wafer 10, FIG. 1). In a manner similar to FIG. 2, in the graph of FIG. 3, the x-axis 230 indicates the spatial position of the sampled integrated circuit device across the wafer (from left to right, as viewed in FIG. 1) while the y-axis 220 indicates the tested initial voltage error, i.e., the amount by which the sampled initial voltage for each integrated circuit device deviates from a desired or "target" reference voltage. The plotted data points 240 correspond to the initial voltage errors for each integrated circuit device located within the series tested.

With reference to FIG. 3, it can be seen that the majority of the tested initial voltage errors of the exemplary points 240 generally vary from about 25 mV near the outer edges of the wafer to about 55 mV near the center of the wafer. Thus, initial voltage error readings for the entire range of points 240 has shifted upward about 60 mV relative to the range of points 140 illustrated in FIG. 2. This approximate 60 mV shift is an example of process shift error. As previously discussed, process shift error is also easily compensated by using a conventional trim program.

Accordingly, the trim program is able to adjust the reference voltages of the integrated circuit devices to compensate for reference voltage deviations caused both by random mismatching and by process shift errors.

Random Defect Errors

It has been found that initial voltage variations can also be caused by randomly placed defects. A randomly placed defect may, for example, take the form of a small, localized crack in the silicon substrate upon which the integrated circuit devices are formed and is typically very difficult to detect due to its small size. Although an integrated circuit device containing a randomly placed defect (sometimes referred to herein as a "defective device") can often be brought into specification with the trim program at a particular temperature, it will typically fail at a later time when it is placed in use and undergoes temperature cycling. In other words, although the initial voltage of a defective device can be adjusted (trimmed) to within specifications at a single temperature (e.g., room temperature), the defect will cause the initial voltage of the defective device to fluctuate widely as temperature fluctuates in an unacceptable manner. Although it is normal for the reference voltage of integrated circuit devices to vary somewhat due to changes in temperature, a defective device will tend to exhibit an overly large voltage variation with temperature change, causing it to fail at temperatures other than the specific temperature at which it was trimmed.

As can be appreciated from the above, random mismatch and process shift initial voltage errors can readily be corrected by a trim program and are not generally indicative of any underlying problem or defect in the device. Although most initial voltage errors caused by random defects can also be corrected by the trim program, the underlying device defects typically result in failure after the device is placed in use. Accordingly, it would be desirable to be able to distinguish initial voltage errors caused by randomly placed defects from those caused by random mismatch and/or process shift errors.

Referring again to FIG. 2, the point 160 graphically represents the tested initial voltage of the corresponding integrated circuit device 60, FIG. 1, which contains a randomly placed defect, as discussed above. As can be seen, the defect in the device 60 causes the tested initial voltage error reading for the point 160 to be substantially different (in this case, higher) than the other devices tested in the series 40. This amount of error, however, is not necessarily outside the range of adjustment achievable by the trim program and, thus, in the normal course of operations, the trim program would simply adjust the initial voltage error of the defective device 160 to at or about zero, in a manner as discussed above. As also discussed above, however, this adjustment is only made at one temperature and the defective device may fail at other temperatures experienced after the defective device is placed into use.

Although the tested initial voltage error point 160 (FIG. 2) is substantially higher than the other devices tested in the series 40, it has been found that it is not feasible to simply single out defective devices by looking for initial voltage errors above or below certain predetermined limits. This is because process shifts, as discussed above, can result in relatively large initial voltage shifts. So, for example, although the point 160 appears to have a relatively high initial voltage error (i.e., about 54 mV), this cannot reliably be used as a rejection criteria because many non-defective devices may exhibit similarly high initial voltage error due to process shift factors. With reference again to FIG. 3, for example, it can be appreciated that many of the points 240 (which correspond to non-defective devices) have initial voltage errors that are higher or equal to the point 160 in FIG. 2. Accordingly, although setting a reject limit of, e.g., 50 mV might catch the defective point 160, FIG. 2, it would also result in the rejection of many non-defective devices because normal process shift variations might easily lie within this range.

It has been discovered, however, that integrated circuit devices containing randomly placed defects can reliably be detected by analyzing tested initial voltage values. Specifically, it has been discovered that a defective device will tend to exhibit an initial voltage that is substantially different relative to its peers, i.e., the devices physically near the defective device on the wafer. An exemplary method for detecting defective devices in this manner is described below.

In general terms, the exemplary method for detecting defective devices begins by acquiring raw data (e.g., initial voltage errors) for a series of devices, in a manner similar to that illustrated in FIG. 2. Next, peer low pass filter values may be calculated by applying a low pass filter operation to the acquired data. Application of a low pass filter operation in this manner serves to smooth the raw data and generally remove process value shifts. Next, the tested initial voltage error value for each device may be compared to the calculated peer low pass filter value. If the difference between the tested initial voltage error and the calculated peer low pass filter value exceeds a predetermined limit, this indicates that the device contains a randomly placed defect and the device in question may then be marked or tagged as a defective part.

As can be appreciated, the method outlined above allows defective devices to readily be detected and subsequently removed from the production stream. An exemplary illustration of the method is explained below.

Table 1 below illustrates data for the first twenty devices in the series of integrated circuit devices 40, FIG. 1. The row numbers 1-20 in the column marked "Row" in Table 1 indicate the first twenty devices counted from the left edge 12 of the wafer 10. Accordingly, Row number 1 denotes the device 42, Row number 2 denotes the device 44, Row number 3 denotes the device 46, and so on. Column A in Table 1 lists the actual tested initial voltage error readings for each device. The Column A data is illustrated graphically in FIG. 1. As discussed previously, a low pass filter operation may be applied to the raw data (Column A in Table 1) in order to remove process value shift effects. Column B of Table 1 lists the calculated peer low pass filter values derived from this low pass filter operation. The methodology for deriving the Column B numbers is discussed in further detail below. Column C of Table 1 lists the absolute value of the difference between the prior calculated peer low pass filter value (Column B, Row-1) and the actual tested initial voltage (Column A, Row n) for each device in Row n.

TABLE 1

| Row | A | B | C |
|---|---|---|---|
| 1 | −29.03 | −29.03 | 0.000 |
| 2 | −28.72 | −28.92 | 0.313 |
| 3 | −28.41 | −28.74 | 0.516 |
| 4 | −31.92 | −29.85 | −3.180 |
| 5 | −22.86 | −27.41 | 6.995 |
| 6 | −25.77 | −26.83 | 1.641 |
| 7 | −23.08 | −25.52 | 3.754 |
| 8 | −18.33 | −23.00 | 7.190 |
| 9 | −9.18 | −18.17 | 13.819 |
| 10 | −20.31 | −18.92 | −2.147 |
| 11 | −21.20 | −19.72 | −2.286 |
| 12 | −22.89 | −20.83 | −3.174 |
| 13 | −21.77 | −21.16 | −0.938 |
| 14 | 54.03 | −13.64 | 75.156 |
| 15 | −18.77 | −15.43 | −5.125 |
| 16 | −19.09 | −16.72 | −3.660 |
| 17 | −17.55 | −17.01 | −0.832 |
| 18 | −16.58 | −16.86 | 0.428 |
| 19 | −15.66 | −16.44 | 1.200 |
| 20 | −14.23 | −15.66 | 2.210 |

The Column B peer low pass filter numbers in the table above may be derived according to the following formula for each Row n in Table 1:

$$\text{IF (AND}(ABS(A_n - B_{n-1}) > \text{OUTLEVEL}, ABS(A_n - A_{n-1}) > \text{INLEVEL}), B_{n-1}*(1-LPFOUT) + A_n*LPFOUT, B_{n-1}*(1-LPFRUN) + A_n*LPFRUN)$$

where:
  OUTLEVEL may be a constant set, for example, to 15
  INLEVEL may be a constant set, for example, to 0
  LPFRUN may be a constant set, for example to 35%
  LPFOUT may be a constant set, for example to 10%
  A and B refer to the Columns A and B, respectively, in Table 1

Accordingly, applying the equation above, a conditional test is first resolved. Specifically, it is determined whether the absolute value of the difference between the present initial voltage reading (Column A, Row n) and the prior peer low pass filter value (Column B, Row n−1) is greater than OUTLEVEL (15, in this example) AND the absolute value of the difference between the present initial voltage reading (Column A, Row n) and the prior initial voltage reading (Column A, Row n−1) is greater than INLEVEL (zero, in this example).

If the conditional test is satisfied, then the new peer low pass filter value for Row n is calculated as the sum of the prior peer low pass filter value (Column B, Row n−1) times 1−LPFOUT (1−LPFOUT equals 90% in this example) and the current initial voltage reading (Column A, Row n) times LPFOUT (LPFOUT equals 10% in this example).

If, on the other hand, the conditional test is not satisfied, then the new peer low pass filter value for Row n is calculated as the sum of the prior peer low pass filter value (Column B, Row n−1) times 1−LPFRUN (1−LPFRUN equals 65% in this example) and the current initial voltage reading (Column A, Row n) times LPFRUN (LPFRUN=35% in this example).

As can be appreciated from the above, the formula, in general terms, uses both the prior peer low pass filter value (Column B, Row n−1) and the current initial voltage reading (Column A, Row n) for each device to derive the new current peer low pass filter value (Column B, Row n). The weighting applied to each of the terms is driven by the conditional portion of the equation. Again, in general terms, the condition is satisfied when the current tested initial voltage reading (Column A, Row n) is different from the prior tested initial voltage reading (Column A, Row n−1) and when the current tested initial voltage reading (Column A, Row n) differs from the prior peer low pass filter value (Column B, Row n−1) by a relatively large amount (15 in the present example). When the condition is satisfied, the formula weights the prior peer low pass filter value (Column B, Row n−1) relatively more heavily (i.e., 90% in the present example). On the other hand, when the condition is not met, the formula weights the prior peer low pass filter value (Column B, Row n−1) relatively less heavily (i.e., 65% in the present example).

Thus, the formula, again in general terms, de-emphasizes the current initial voltage measurement (Column A, Row n) when it differs relatively greatly from the prior peer low pass filter value (Column B, Row n−1). The purpose of the dual weighting portion of the equation is to prevent a defect from affecting the low pass filter too significantly. Although used in this embodiment for illustrative purposes, it is to be understood that this dual weighting aspect represents an optional portion of the equation.

It is noted that the initial value for the prior peer low pass filter (i.e., Column B, Row n−1 in Table 1 above) may simply be set equal to the current initial voltage reading (i.e., Column A, Row n) when no prior peer low pass filter or prior initial voltage reading data is available.

As noted above, Column C in the table lists the absolute value of the difference between the prior peer low pass filter data and the actual tested initial voltage error for each device (i.e., the absolute value of Column A, Row n minus Column B, Row n−1). The numbers in Column C may then be used to identify devices to reject by comparing the values in Column C to a predetermined limit. In the current example, the predetermined limit has been selected to be equal to 25. Accordingly, any device exhibiting a number in Column C exceeding 25 would be rejected. Referring again to the Table 1, it can be seen, for example, that the device in Row 14 would fail since its Column C value is 75.156 which exceeds the predetermined limit of 25. Accordingly, the device 60, FIG. 1, would be flagged as a rejected part since the data in Row 14 of the table corresponds to the device 60 and since the Row 14 data indicates that the device 60 contains a random defect. It is noted that the predetermined reject limit discussed above may be set, for example, by examining the Column C data to determine the mean and standard deviation. The reject limit may, for example, be chosen to be approximately the mean plus three standard deviations.

Figure 4:
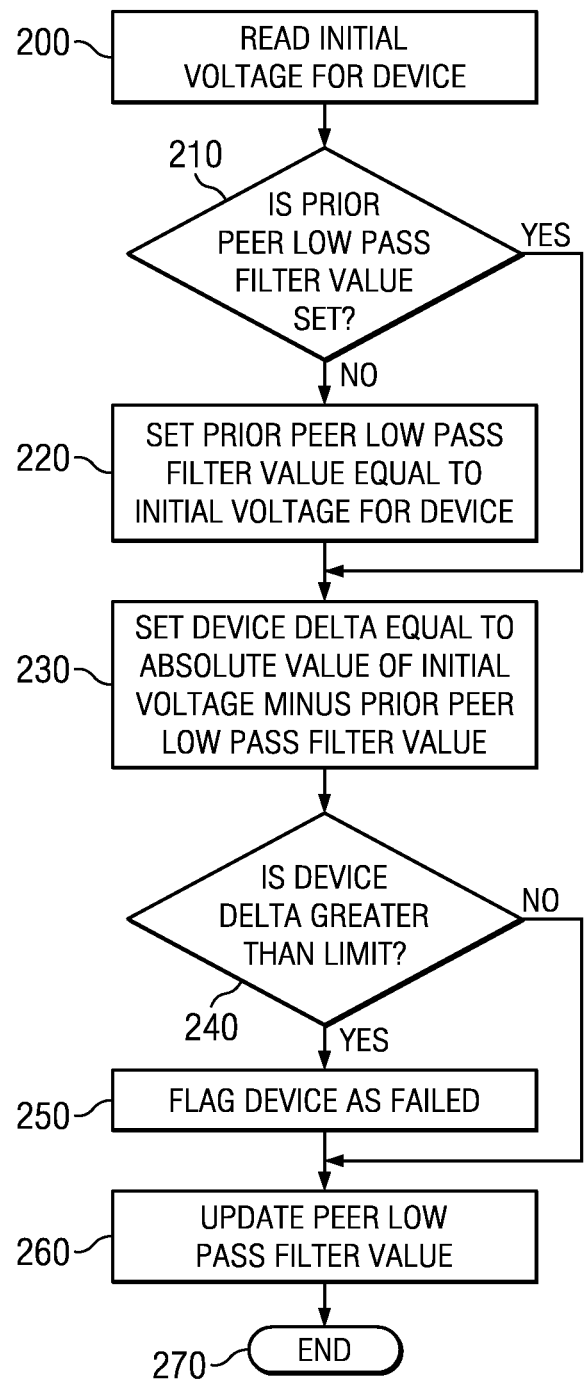
FIG. 4 is a flow chart illustrating an exemplary methodology for testing integrated circuit devices.

FIG. 4 generally illustrates the methodology described above in flowchart form. With reference to FIG. 4, the process begins for each device in block 200 where the initial voltage for the current device is read (i.e., Column A, Row n in Table 1 above). Next, in block 210, a determination is made as to whether or not a peer low pass filter value has been set for the prior device (i.e., Column B, Row n−1 in Table 1). If not, then, in block 220 of FIG. 4, the prior low pass filter value (i.e., Column B, Row n−1 in Table 1) may be set equal to the current device initial voltage reading (i.e., Column A, Row n). Next, in block 230 of FIG. 4, a device delta for the current device (i.e., Column C, Row n in Table 1) may be set to equal the absolute value of the difference between the current device initial voltage reading (i.e., Column A, Row n in Table 1) and the prior peer low pass filter value (i.e., Column B, Row n−1 in Table 1). Next, in block 240, a determination is made as to whether the device delta calculated in block 230 (i.e., Column C, Row n in Table 1) is greater than a predetermined limit (i.e., 15 in the example set forth above). If the device delta does exceed the predetermined limit, then the process flows to block 250 where the device is flagged as "Failed". Next, in block 260, a new peer low pass filter value is calculated according to the formula set forth above and recorded (i.e., in Column B, Row n in Table 1). In block 270, the process ends. Thereafter, the process may be repeated, beginning at block 200 for the next device (i.e., for the next Row n in Table 1).

As can be appreciated, the methodology described above may be used to identify and flag devices having random defects by analyzing initial voltage data acquired, for example, during a conventional test/trim operation. The use of a low pass filter effectively removes process value shift effects from the data being analyzed. When a device displays an initial voltage deviation that is greater than that caused by random mismatching it may be marked as scrap and not packaged or sent to customers.

The foregoing description of specific embodiments of a defect detection methodology has been presented for purposes of illustration and description. They are not intended to be exhaustive or to limit the defect detection methodology to the precise forms disclosed, and many modifications and variations are possible in light of the above teaching. The illustrated embodiments were chosen and described in order to best explain the principles of the defect detection methodology and its practical application, to thereby enable others skilled in the art to best utilize the various embodiments of the methodology with various modifications as are suited to the particular use contemplated. It is intended that the scope of the invention be defined by the claims appended hereto and their equivalents, except as limited by the prior art.

What is claimed is:

1. A method of testing a selected integrated circuit device located within a series of integrated circuit devices, said method comprising:
    obtaining, using a tester, measured values for each of a plurality of integrated circuit devices located within said series, based on a predetermined parameter;
    calculating a peer value based on said measured values by applying a low pass filter operation to said measured values;
    obtaining a measured value for said selected integrated circuit device, based on said predetermined parameter;
    calculating a variance between said measured value for said selected integrated circuit device and said peer value; and
    identifying said selected integrated circuit device as defective if said variance exceeds a predetermined value.

2. The method of claim 1 and further comprising:
    after said obtaining a measured value for said selected integrated circuit device, using said measured value to update said peer value.

3. The method of claim 1 and further wherein:
    said predetermined parameter comprises voltage.

4. The method of claim 1 and further wherein:
    said series of integrated circuit devices are located on a wafer.

5. The method of claim 1 and further wherein:
    said series of integrated circuit devices is a contiguous series of integrated circuit devices.

6. The method of claim 1 and further wherein:
    said obtaining measured values for each of a plurality of integrated circuit devices located within said series comprises obtaining measured values for each of a plurality of integrated circuit devices located prior in said series relative to said selected integrated circuit device.

7. The method of claim 1 and further comprising:
    determining said predetermined value based on a plurality of said measured values.

8. The method of claim 7 and further wherein:

said determining said predetermined value comprises calculating the mean and the standard deviation for said plurality of measured values.

9. The method of claim 8 and further wherein:

said predetermined value is calculated as said mean plus three standard deviations.

10. A method of testing a selected integrated circuit device, said method comprising:

obtaining measured values, using a tester, said values based on a predetermined parameter, for each of a plurality of peer integrated circuit devices, wherein said plurality of peer integrated circuit devices include at least one integrated circuit device that is proximate said selected integrated circuit device;

calculating a peer value based on said measured values applying a low pass filter operation to said measured values;

obtaining a measured value for said selected integrated circuit device, based on said predetermined parameter;

calculating a variance between said measured value for said selected integrated circuit device and said peer value;

identifying said selected integrated circuit device as defective if said variance exceeds a predetermined value.

11. The method of claim 10 and further comprising:

after said obtaining a measured value for said selected integrated circuit device, using said measured value to update said peer value.

12. The method of claim 10 and further wherein:

said predetermined parameter comprises voltage.

13. The method of claim 10 and further wherein:

said selected integrated circuit device is located on a wafer.

14. The method of claim 13 and further wherein said plurality of peer integrated circuit devices are located on said wafer.

15. The method of claim 10 and further wherein:

said integrated circuit devices within said plurality of peer integrated circuit devices are contiguous with one another.

16. The method of claim 10 and further wherein:

said at least one integrated circuit device that is proximate said selected integrated circuit device comprises at least one integrated circuit device that is adjacent said selected integrated circuit device.

17. The method of claim 10 and further comprising:

determining said predetermined value based on a plurality of said measured values.

18. The method of claim 17 and further wherein:

said determining said predetermined value comprises calculating the mean and the standard deviation for said plurality of measured values.

* * * * *